United States Patent [19]

Miyamoto et al.

[11] Patent Number: 5,277,357

[45] Date of Patent: Jan. 11, 1994

[54] PROCESS FOR MAKING A METAL WALL OF A PACKAGE USED FOR ACCOMMODATING ELECTRONIC ELEMENTS

[75] Inventors: Takaharu Miyamoto, Suzaka; Fumio Miyagawa; Tsutomu Higuchi, both of Nagano, all of Japan

[73] Assignee: Shinko Electric Industries Co., Ltd., Nagano, Japan

[21] Appl. No.: 882,967

[22] Filed: May 14, 1992

[30] Foreign Application Priority Data

| May 16, 1991 | [JP] | Japan | 3-141215 |
| Jul. 8, 1991 | [JP] | Japan | 3-194942 |
| Mar. 6, 1992 | [JP] | Japan | 4-84779 |

[51] Int. Cl.⁵ .......................................... H01R 43/16
[52] U.S. Cl. ................................. 228/142; 228/173.6; 72/379.2; 72/379.4; 413/4; 413/21
[58] Field of Search ............... 228/170, 173.6, 184, 228/142; 413/4, 7, 21; 72/379.4, 379.2

[56] References Cited

U.S. PATENT DOCUMENTS

| 1,455,525 | 5/1923 | Finley | 228/173.6 |
| 1,785,025 | 12/1930 | Felsenthal | 72/379.2 |
| 3,075,487 | 1/1963 | Appleton | 228/170 |
| 3,409,976 | 11/1968 | Kesling | 228/170 |
| 3,528,173 | 9/1970 | Gall | 228/173.6 |
| 3,925,883 | 12/1975 | Cavalear | 228/170 |
| 4,991,291 | 2/1991 | Koepke et al. | 228/142 |

FOREIGN PATENT DOCUMENTS

| 0233824 | 8/1987 | European Pat. Off. |  |
| 2440675 | 5/1980 | France. |  |
| 57-44420 | 3/1982 | Japan | 72/379.2 |
| 82/03574 | 10/1982 | World Int. Prop. O. | 72/379.2 |
| 90/05378 | 5/1990 | World Int. Prop. O. |  |

Primary Examiner—Richard K. Seidel
Assistant Examiner—Jeffrey T. Knapp
Attorney, Agent, or Firm—Staas & Halsey

[57] ABSTRACT

A process for making a metal wall enclosure of a package for housing an electronic element. An elongated strip, to be formed as the metal sidewall of the enclosure, and a bottom plate, for closing an open end of the metal sidewall, are formed from a sheet of metal stock. At least one aperture is selectively provided in at least one of the bottom plate and the planar metal strip. The strip is prepared for folding, such as by transverse grooves formed in the strip along predetermined fold lines corresponding to corners of the metal sidewall, to facilitate folding of the strip into the desired configuration of the metal sidewall and with the opposite ends of the strip, as folded to form the metal sidewall, in abutting relationship. The abutting ends of the metal strip, as folded to form the metal sidewall, are affixed and hermetically sealed together and the lower edge of the metal sidewall, as formed from the folded strip, is affixed and hermetically sealed to the bottom plate to complete the metal wall enclosure. The at least one aperture is at a predetermined position in the metal wall enclosure and of a size for receiving a connector for providing a connection therethrough, and thus from the exterior of the package and through the enclosure, to the electronic element housed within the package.

9 Claims, 13 Drawing Sheets

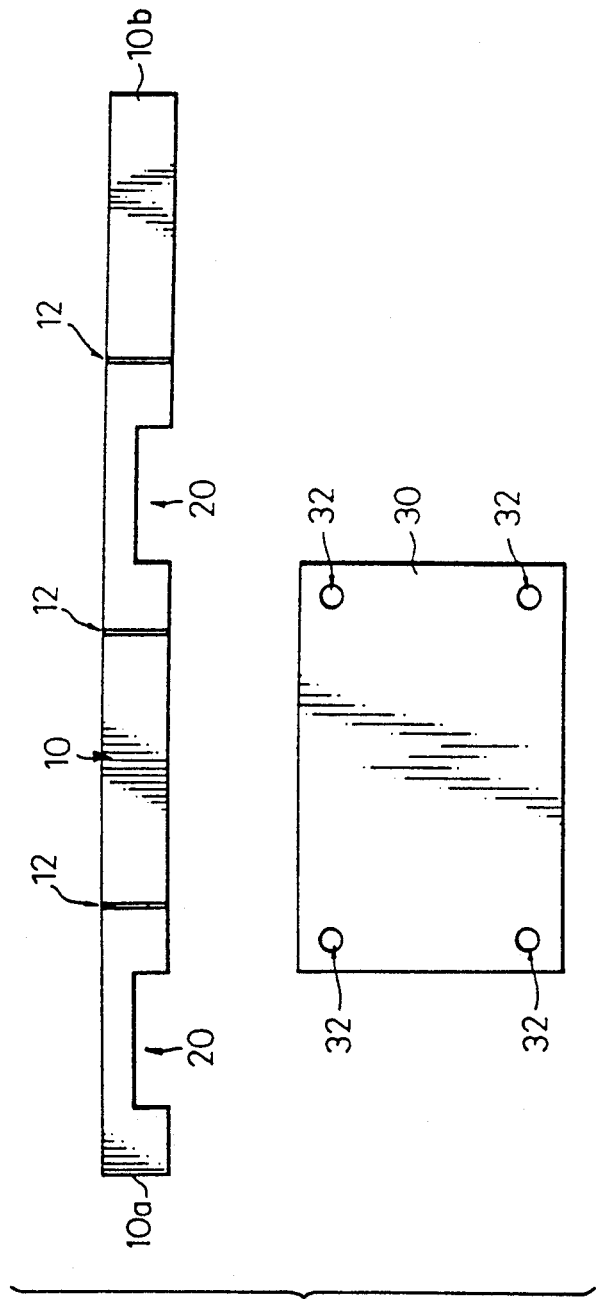
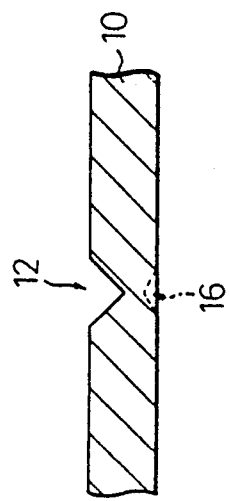
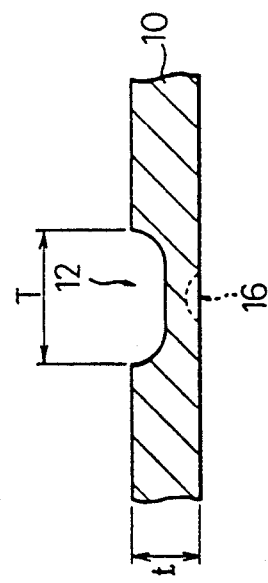

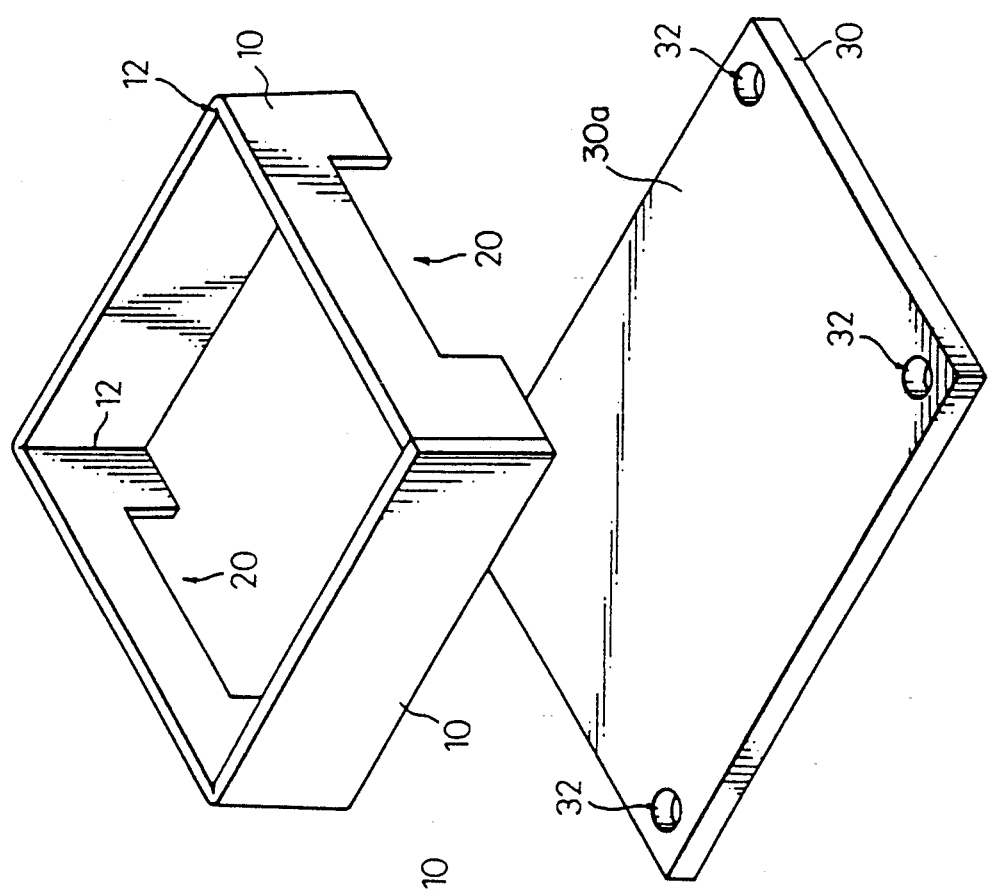
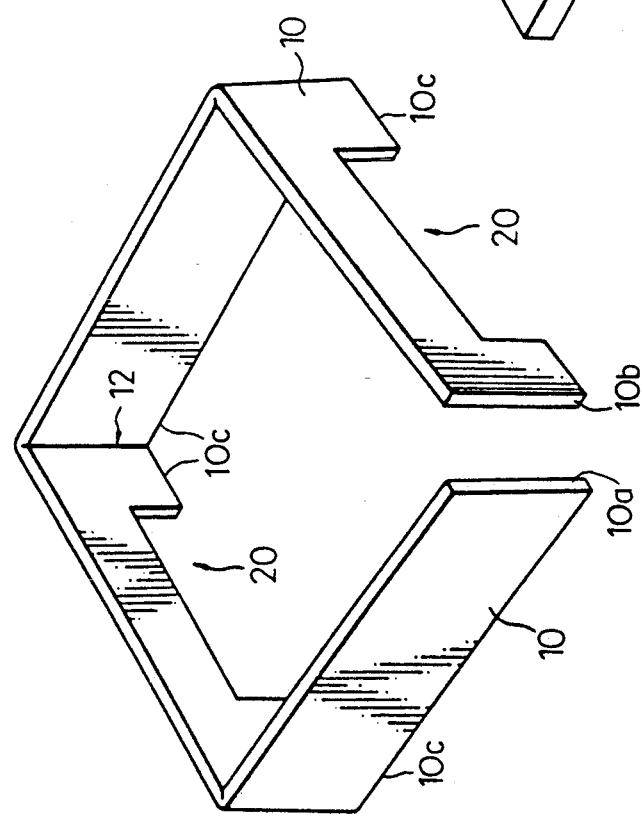

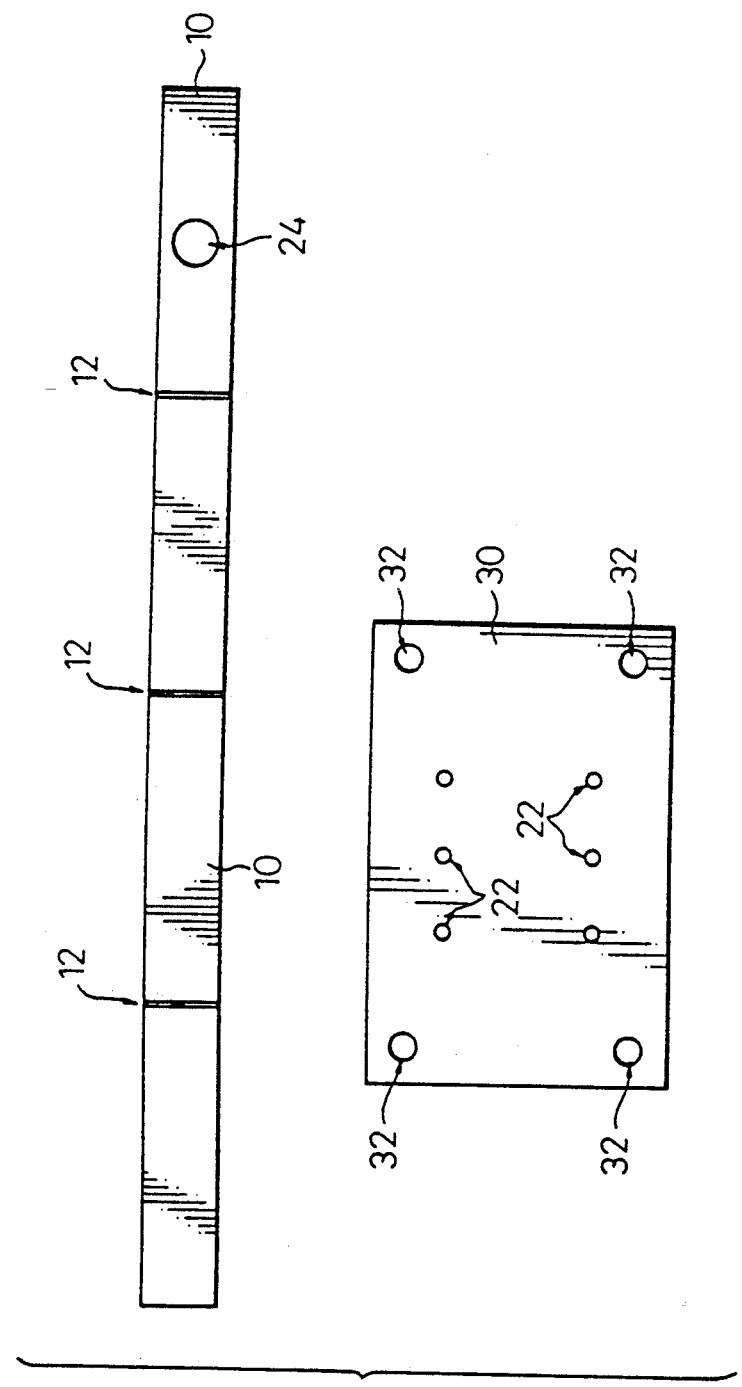

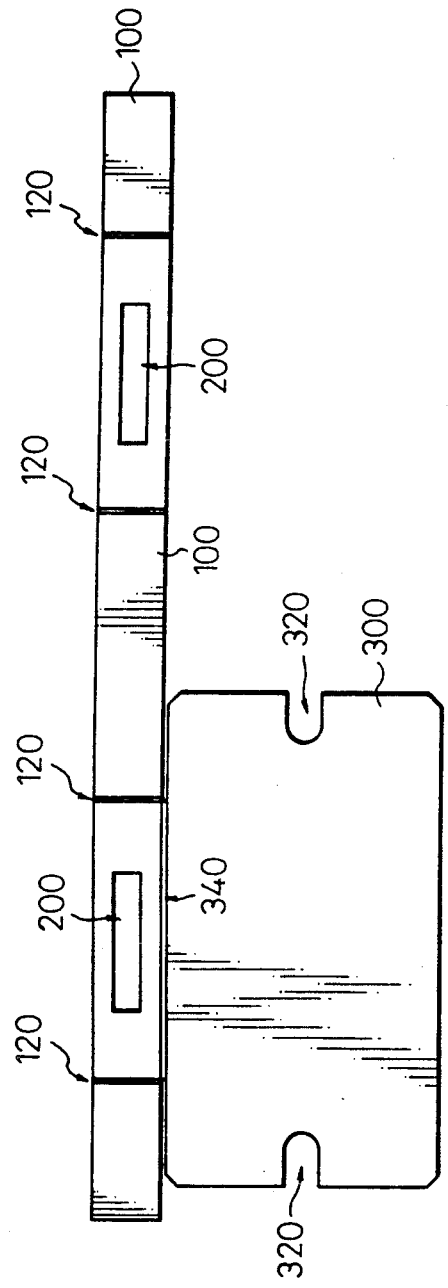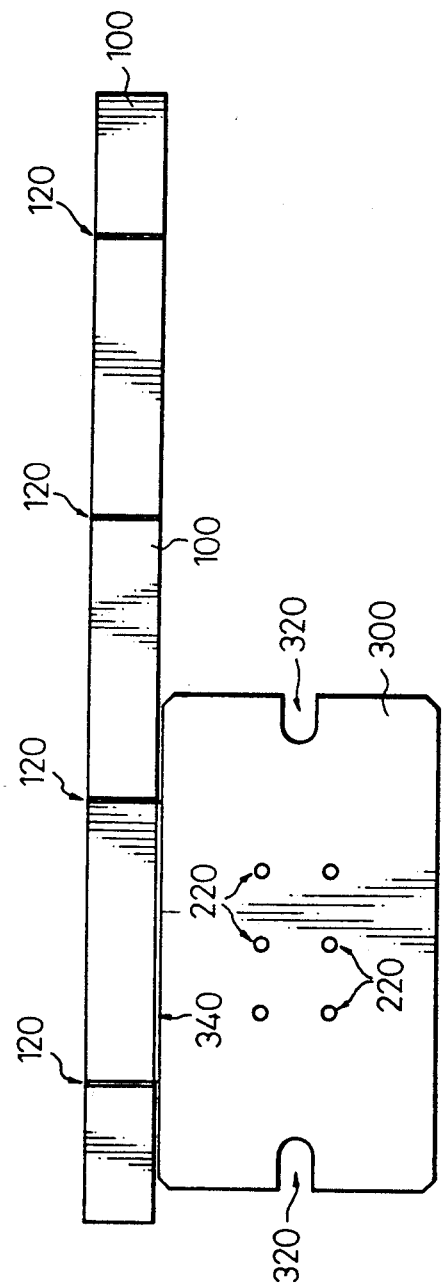

PROCESS FOR MAKING A METAL WALL OF A PACKAGE USED FOR ACCOMMODATING ELECTRONIC ELEMENTS

BACKGROUND OF THE INVENTION

1. Field of the Invention

This invention relates to a process for making a metal wall enclosure of a package to be used for accommodating electronic elements, such as a semiconductor chip or the like.

2. Prior Art

A metal package having a circumferential wall formed of metal has been conventionally known in the prior art, for use as a package for accommodating electronic elements. Such a metal package can be made by a first or a second process as mentioned below.

The first process comprises a step for mechanically machining a metal block to form an integral metal wall.

The second process comprises a step for cutting a cylindrical hollow tube having a rectangular cross-section into a ring-like shape having a sidewall of a predetermined axial height, forming an aperture in the hollow tube sidewall used for installing therein a ceramic terminal frame or the like, and thus forming the metal side wall of the enclosure. A metal bottom wall is hermetically attached to the bottom edge of the side wall, thereby to close the bottom, open end of the sidewall, as formed from the hollow tube.

However, according to the first process, a large amount of laborious work and time are required, since a metal block must be machined to form an integral metal wall.

According to the second process, a hole (i.e., an aperture in a pre-formed wall) which is used for installing a ceramic terminal frame or the like must be formed by an electric spark process, not by a punching process. Thus, a large amount of laborious work and time are also required.

SUMMARY OF THE INVENTION

An object of the present invention is to provide a process for making a metal wall enclosure of a package to be used for accommodating an electronic element, in which the metal wall enclosure can easily and rapidly be made without a large amount of laborious work and time, so that the drawbacks of the prior art as mentioned above can be overcome.

According to the first aspect of the present invention, there is provided a process for making a metal wall enclosure of a package to be used for accommodating an electronic element, the metal wall enclosure comprising a ring-like, frame-shaped metal side wall and a metal bottom plate, the process comprising: a step for providing a strip, to be used for forming said metal side wall and/or a metal plate for forming said bottom plate, with an opening, recess or hole for receiving and sealing therein a lead, or for inserting and sealing therein an optical fiber, or for fitting and sealing therein a ceramic terminal; a step for folding said strip for forming said metal side wall into a ring-like frame-shaped sidewall; a step for hermetically attaching and thus sealing the abutted, opposite ends of said frame-shaped sidewall to each other; and a step for hermetically attaching and thus sealing a metal bottom plate to the open, lower periphery (i.e., bottom edge) of said frame-shaped metal sidewall.

In the first aspect of the present invention, it is advantageous that said process further comprises a step for providing transverse grooves on an inner surface of said strip for forming said metal side wall, and said strip is then folded along said grooves into the ring-like frame-shaped sidewall.

According to the second aspect of the present invention, there is provided a process for making a metal wall enclosure of a package to be used for accommodating an electronic element, said metal wall enclosure comprising a single metal strip formed into a ring-like frame-shaped side wall portion and a bottom plate portion, the latter continuously connected to said side wall portion, said process comprising: a step for providing said side wall portion and/or said bottom plate portion with an opening, recess or hole for inserting a lead, inserting an optical fiber, or fitting a ceramic terminal thereinto and sealing same therein; a step for folding said strip to form said side wall portion as a rectangular frame-shaped sidewall; a step for folding said bottom plate portion toward said rectangular frame-shaped sidewall; a step for hermetically attaching and thereby sealing the opposite ends of said frame-shaped strip sidewall to each other; and a step for hermetically attaching and thus sealing said bottom plate portion to the open, lower periphery (i.e., the bottom edge) of said frame-shaped strip sidewall.

In the second aspect of the present invention, it is also advantageous that said process further comprises a step for providing transverse grooves on an inner surface of said strip and said strip is then folded along said grooves to form the rectangular frame-shaped sidewall.

In the above-mentioned first and second aspects of the present invention, it is advantageous that at least one of said opposite ends of said side wall portion is cut along an edge thereof, so that, after said respective ends of said side wall portion strip are joined to each other by abutting same, a groove for collecting a solder or adhesive is formed between said opposite ends.

Thus, according to the first and second aspects of the present invention, it is no longer necessary to mechanically machine a metal block to form an integral metal wall. Also, it is no longer necessary to cut a cylindrical hollow tube having a rectangular cross-section into a ring-like shape having a predetermined axial length.

Therefore, a large amount of laborious work and time are no longer required. Thus, a metal wall of a package for this purpose can easily and rapidly be made, so that the drawbacks of the prior art as mentioned above can be overcome. In addition, a large amount of waste metal material is no longer generated.

Also, an opening, recess or hole in the sidewall for receiving and sealing therein a lead member, an optical fiber, or a ceramic terminal can easily and rapidly be formed, since such an opening, recess or hole can be formed in advance, in the flat strip material, before the latter is formed into the ring-shaped sidewall.

BRIEF DESCRIPTION OF THE DRAWINGS

FIG. 1 is a plan view illustrating a first process for making a metal sidewall of a package from a metal strip having grooves therein, according to the present invention;

FIGS. 2 and 3 are enlarged cross-sectional views of alternative grooves, respectively of U- and V-shaped groove configurations, shown in FIG. 1;

FIGS. 4, 5 and 6 are perspective views illustrating the first process for making a metal wall enclosure in accordance with this invention;

FIG. 7 is a plan view illustrating an embodiment of the first process for making a package metal wall enclosure according to the present invention;

FIG. 14 is a plan view illustrating a second process for making a metal wall enclosure of a package according to the present invention;

FIG. 15 is a plan view illustrating an embodiment of the second process for making a metal wall enclosure of a package according to the present invention;

DETAILED DESCRIPTION OF THE PREFERRED EMBODIMENTS

Figure 6:
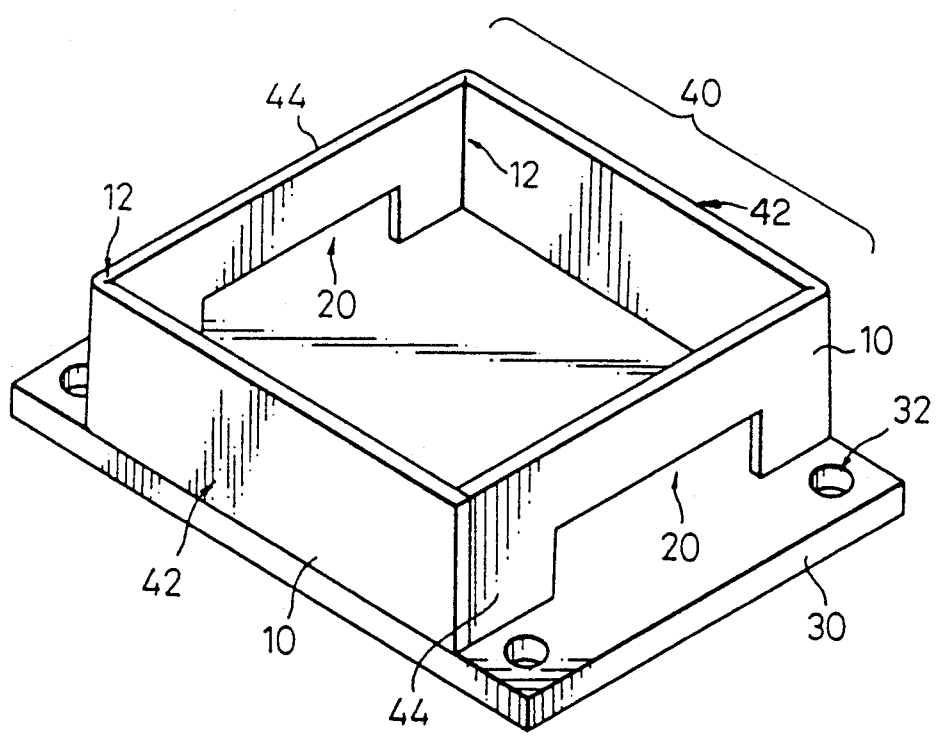
Figure 9:
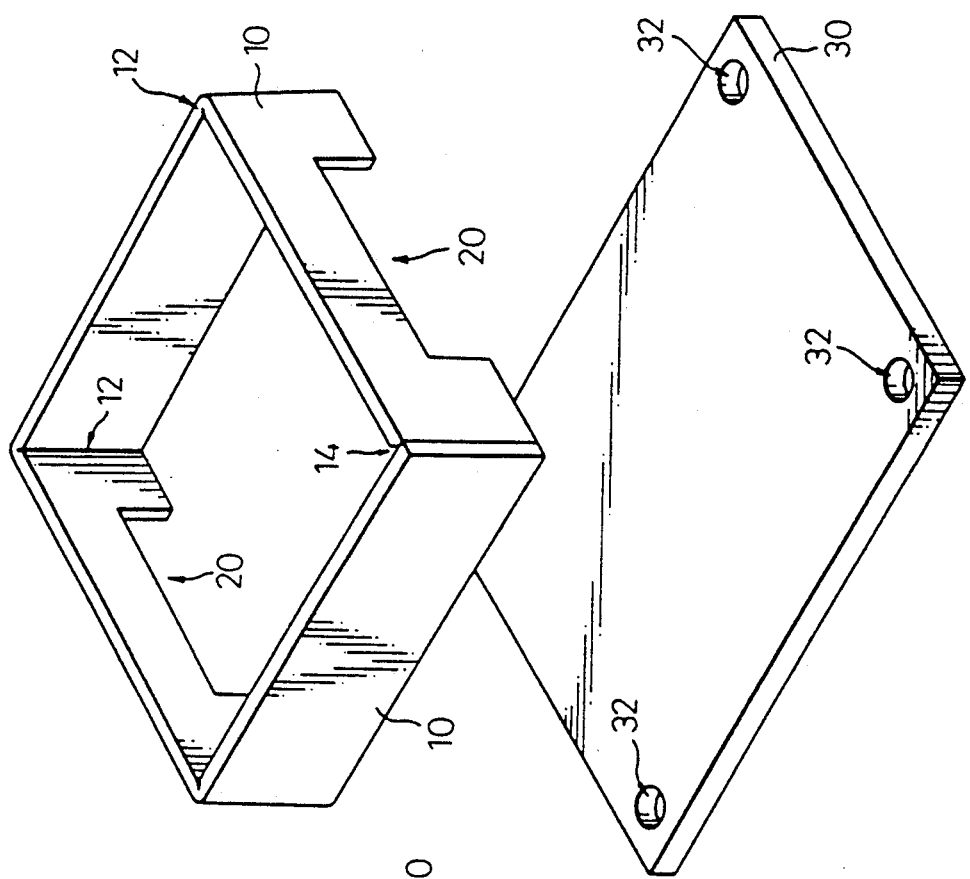
FIGS. 8 through 10 are perspective views illustrating the embodiment of the first process for making a package metal wall enclosure according to the present invention.
Figure 8:
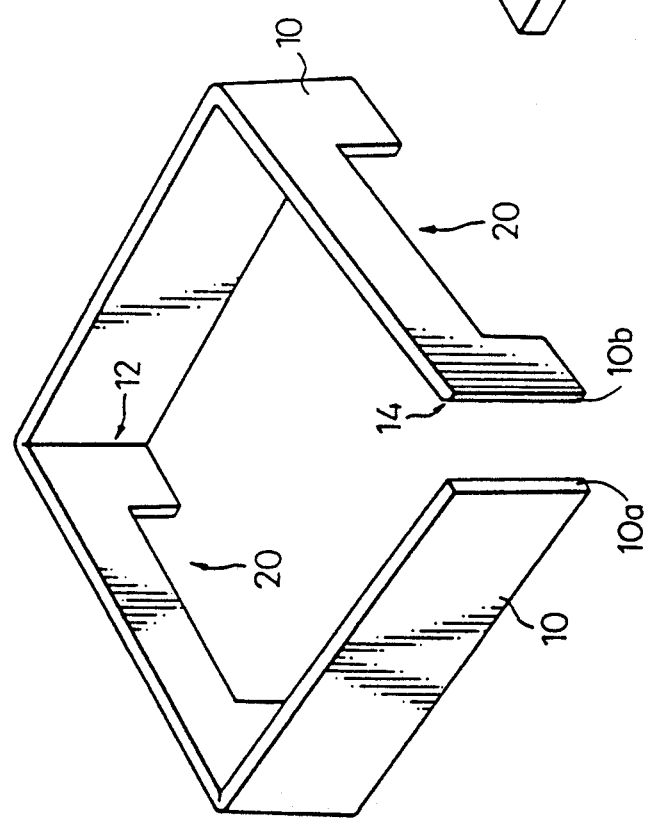
Figure 10:
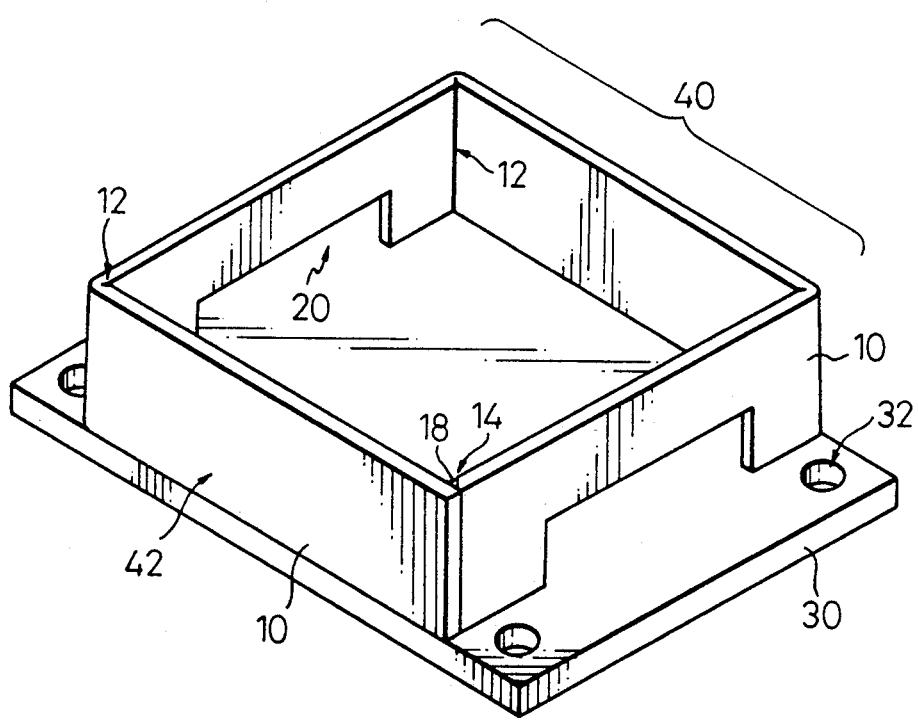

The preferred embodiments will now be described in detail with reference to the accompanying drawings.

FIGS. 1-6 shown a preferred embodiment of a first process for making a metal wall enclosure of a package according to the present invention, and particularly steps for forming thereof.

FIG. 1 shows a strip 10 for forming a package metal side wall. The strip 10 is a metal plate made of Koval (Fe-Ni-Co alloy), 42 Alloy (Fe-Ni Alloy) or the like, having a thermal coefficient matching that of a ceramic terminal frame or a glass material, to be used for hermetically sealing lead members and having a good wetting characteristics with respect to solder material. Such a strip is made by cutting a sheet of metal plate stock, such as by an etching process, a punching process, a wire-cut electric spark process or the like.

As shown in the enlarged views of FIGS. 2 and 3, the strip 10 is provided, at several predetermined positions at which it is to be folded, on the inner surface thereof with grooves 12 each having a U- or V-shaped cross-section. The grooves 12 can be formed by. such as, a half etching process, a punching process, or the like.

Also, the strip 10 is provided at predetermined positions with transverse openings or recesses 10 (i.e., apertures), into which respective ceramic terminals (not shown) are to be inserted. The openings 20 can be formed by an etching process, a punching process, a wire-cut electric spark process, or the like.

The strip 10 may be provided, in place of or in addition to the ceramic terminal insertion openings 20, with openings (i.e., apertures) for inserting optical fibers or for inserting and hermetically sealing therein leads, in accordance with the intended type and usage of the metal wall structure, itself.

It is advantageous that these grooves 12 and openings 20 can be simultaneously formed at the time of cutting the strip 10, itself, from the sheet of metal plate stock.

Such grooves 12 and openings 20 can also be formed before or after the strip 10, itself, is made by cutting the same from a metal plate stock.

As shown in FIG. 4, the strip 10 is then folded inwardly along the U- or V-shaped grooves 12, as provided at several predetermined positions on the inner surface thereof, so that a ring-shaped, or box-shaped, rectangular frame, each corner being defined by 90°, is formed as shown in FIG. 5.

The opposite, free ends 10a and 10b of the strip 10 then are mutually joined (i.e., abutted and engaged with one another) and fixedly, hermetically connected, and thus sealed, to each other by a welding process.

The ends 10a and 10b of the strip 10 may also be hermetically connected by using a suitable adhesive.

Then the lower edge 10c, defining the lower opening of the ring-shaped rectangular folded strip 10, is hermetically affixed and sealed to the upper main surface 30a of a bottom metal plate 30 by a soldering process, e.g., using a silver-solder. Otherwise, the ring-shaped rectangular folded strip 10 may be hermetically connected at its bottom edge 10c to the bottom metal plate 30 by a suitable adhesive or a glass material.

The metal strip 10 and the bottom plate 30 may be set in a suitable positioning means (i.e., a jig) made of a heat resistance carbon material, so that both the metal strip 10 and the bottom plate 30 are mutually positioned with respect to each other, and then they are inserted into a high temperature furnace in which the opposite ends of the metal strip 10 and the mating surfaces of the metal strip 10 and the bottom plate 30 are simultaneously adhered together by soldering.

The opposite ends 10a and 10b of the metal strip 10 and the respective mating surfaces of the metal strip 10 and the bottom plate 30 need not be simultaneously adhered, but instead the respective ends 10a and 10b of the metal strip 10 may be first adhered to each other by soldering and then the respective mating surfaces of the metal strip 10 and the bottom plate 30 may be adhered to each other by soldering.

Thus, as shown in FIG. 6, there is obtained a metal wall enclosure 40 having a pair of opposite side walls 42 and a pair of opposite end walls 44. Each of the end walls 44 is disposed so that the respective opening (or aperture) 20 is at a predetermined position relatively to the bottom plate 30 and within each of the side and end walls 42 and 44.

A more detailed embodiment of the first process for making the metal wall enclosure 40 as shown in FIGS. 1 through will now be described with reference to FIGS. 7 through 13.

FIG. 7 is similar to FIG. 1 and shows a preferred embodiment of the first process for making the metal wall enclosure.

A metal strip 10 is provided at a predetermined position with a relatively large circular hole 24 for inserting an optical fiber. On the other hand, the metal bottom plate 30 is provided at predetermined positions with relatively small several circular holes 22 for receiving therethrough and hermetically sealing therein lead members (not shown). These holes 24 and 22 are formed, respectively, in the metal strip 10 before it is folded to a ring-shaped rectangular frame (i.e., sidewall) and in the metal bottom plate 30 before it is affixed to the rectangular frame (sidewall) formed of the metal strip 10.

In the same manner as the embodiment shown in FIGS. 1 to 6, the strip 10 is provided at several positions, at which it will be folded and on the inner surface thereof, with grooves 12 each having a U- or V-shaped cross-section. Thus, the same members or portions are indicated by the same reference numerals as FIGS. 1–6.

FIGS. 8 through 13 show another preferred embodiment of the first process for making the metal wall. In this embodiment, as shown at 14 in FIG. 8, at least one of the opposite ends 10a, 10b of the metal strip 10 (e.g., the end 10b) is cut along an edge thereof.

Figure 11:
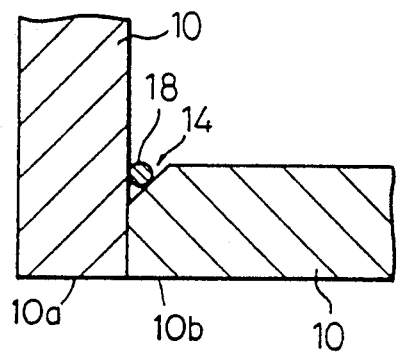
FIGS. 11 through 13 are enlarged cross-sectional views of the abutting ends of the folded strip in the first process for making a package metal wall enclosure.
Figure 12:
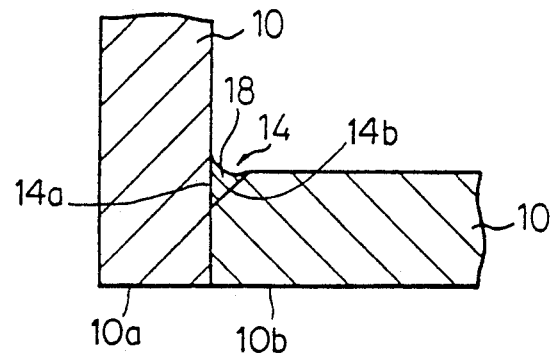
Figure 13:
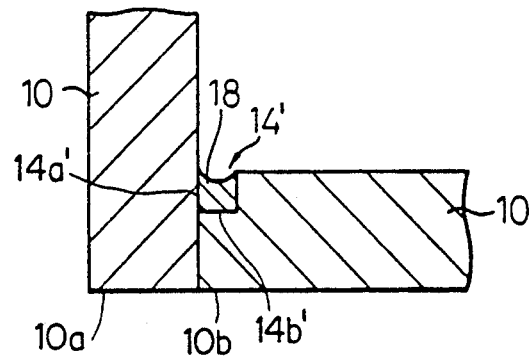

As shown in more detail in FIGS. 11 and 12, the end 10b of the metal strip 10 is provided at the inner edge thereof with an inclined cut 14. As an alternative, as shown in FIG. 13, the end 10b of the metal strip 10 is provided at the inner edge thereof with a L-shaped cut groove 14'. Thus, when a ring-shaped rectangular frame is formed from the metal strip 10 by joining the opposite ends 10a, 10b together with respect to each other, the solder or adhesion material 18 can be collected in the respective V-shaped or L-shaped grooves 14 and 14'.

As shown in FIG. 11, a rod-like solder material 18 is fitted into the adhesion collecting groove 14 of the metal strip 10 and then the structure is put into a high temperature furnace in which the solder material 18 melts and flows into and permeates the interface between abutting surfaces and the spaced, opposing faces (14a, 14b and 14a', 14b') defined by the groove(s) (14, 14') at the respective ends of the metal strip 10. As shown in FIGS. 12 and 13, the ends 10a, 10b of the metal strip 10 are hermetically sealed to each other by the solder material 18.

Otherwise, a thin flat solder (not shown) for sealing may be inserted into the abutting gap between the respective end faces of the metal strip 10 and then the work may be put into a high temperature furnace, in which the solder flows into the abutting gap between the respective ends of the metal strip 10. Thus, the respective ends of the metal strip 10 may be hermetically sealed to each other by the solder.

The solder material can be accumulated in successive layers to the desired thickness in the adhesion collecting groove 14 of the metal strip 10 due to the surface tension exerted on the solder material. Thus, the sealing effect on the abutting faces between the respective ends of the metal strip 10 can be improved. Also, the solder material can be collected in the adhesive collecting groove 14 due to surface tension to prevent the solder material from flowing out of the collecting groove 14.

The reasons why the sealing effect on the abutting faces is improved are as follows.

In general, when the metal strip 10 is folded into a rectangular frame, the folded portions are not always bent correctly at 90°, but readily are deformed or bent to a skewed relationship with respect to the side edges of the strip 10. Thus, the abutting portions of the respective ends of the metal strip 10 are not always flat, but in many cases are uneven. In that case, the respective ends of the metal strip 10 do not contact each other in full surface contact, but only in a point contact or a line contact. In this case, a solder material cannot uniformly flow into and permeate the abutting gap. Thus, unfavorable voids or leakage passages (not shown) would be generated in the solder material between the opposite ends of the metal strip 10. Thus, the sealing effect of the metal strip 10 would be affected adversely.

In order to overcome the problems as mentioned above, it is proposed that the amount of the solder material be increased. In this case, however, the unfavorable voids or leak passages generated in the solder material are not reduced, but it becomes more difficult to find such voids or leak passages, since the thickness of the solder material is increased. In addition, a stress would be exerted on the solder material due to the difference in the respective thermal expansion coefficients of the metal wall and the solder material. The solder material would flow out and attach on the unfavorable portions.

According to the present invention, however, since the adhesion collecting groove 14 is provided along the transverse edge between the opposite and abutting ends 10a, 10b of the strip 10, the solder material can be accumulated in layers to the desired thickness in the adhesion collecting groove 14 of the metal strip 10 due to the surface tension exerted on the solder material. Thus, the solder material can be collected in the adhesion collecting groove 14 due to surface tension and the sealing effect on the abutting faces between the respective ends of the metal strip 10 can be improved.

FIG. 14 shows a preferred embodiment of a second process for making a metal wall of a package.

In this embodiment, a metal strip 100 is similar to the strip 10 shown in FIG. 1, by itself. But the metal strip 100 is integrally and continuously connected at an intermediate portion of the lower edge thereof to a bottom metal plate 300, which is provided at the opposite ends thereof with respective, U-shaped recesses 320, for receiving screws therethrough for mounting the metal wall 300 onto a printed board or the like. The metal strip 100 and the metal bottom plate 300 are made of a single metal plate, such as Koval, 42 alloy or the like, and are obtained by integrally cutting the same by a punching process, an etching process, a wire-cut electric spark process, etc., from plate stock.

The metal strip 100 is provided on the inner surface thereof at the several predetermined positions (four positions in the drawing), at which it is to be folded, with transverse grooves 120 each having a U- or V-shaped cross-section. On the other hand, the metal bottom plate 300 is also provided on the inner surface thereof, and at the position of the boundary between the metal strip 100 and the metal bottom plate 300, with a longitudinal groove 340 having a U- or V-shaped cross-section. These grooves 120 and 340 can be formed by a half-etching process or a punching process.

The metal strip 100 further is provided, at predetermined positions, with longitudinal openings 300 for fitting ceramic terminals (not shown). Such openings 200 can be formed by a punching process or an etching process.

The strip 100 may be provided, in place of or in addition to the ceramic terminal insertion openings 200, with openings for inserting optical fibers or hermetically sealing leads, in accordance with the intended type and purpose of the metal wall structure enclosure, itself.

It is advantageous that these grooves 120, 340 and openings 200 be simultaneously formed at the time of cutting the strip 100 and the bottom metal plate 300, themselves, from the metal plate stock.

Such grooves 120, 340 and openings 200 may be formed either before or after the strip 100 and the bottom plate 300 are made —i.e., as before stated, by cutting the same from the metal plate stock.

Then, the strip 100 is folded inwardly along the several U- or V-shaped grooves 120 provided that the predetermined portions on the inner surface thereof, so that a ring-shaped rectangular frame, each corner being defined by 90° is obtained from the metal strip 100 except for the metal bottom plate 300.

The respective ends of the strip 100 are mutually joined and fixedly, hermetically connected to each other by a welding or soldering process to obtain a ring-shaped rectangular frame.

The ends of the strip 100 then are hermetically connected by using any suitable adhesive.

Then, the lower opening defined by the bottom edge of the rectangular folded strip 100 is hermetically closed by the bottom plate 300 by a soldering process, using such as a silver-solder. Otherwise, the rectangular folded strip 100 may be hermetically connected to the bottom plate 300 by a suitable adhesive or glass material.

The strip 100 and the bottom plate 300 may be set in a suitable positioning means (e.g., a jig, not shown) made of a heat resistance carbon material, so that both the strip 100 and the bottom plate 300 are mutually positioned to each other, and then they are inserted into a high temperature furnace in which the opposite ends of the strip 100 and the bottom edge of the metal strip 100 and the corresponding portion of the upper main surface of the bottom plate 30 are simultaneously adhered to each other by soldering.

The opposite ends of the strip 100 and the bottom edge of the metal strip 100 and the corresponding position of the upper main surface of the bottom plate 300 may be adhered to each other by soldering.

Thus, there is obtained a metal wall enclosure made of Koval, 42 alloy or the like, provided at the side walls thereof with the openings 200 for receiving and fitting therein ceramic terminals.

FIG. 15 shows another embodiment, similar to that shown in FIG. 14, for making a metal wall enclosure of a package.

In this embodiment, before the bottom plate 300 is folded toward the strip 100, the bottom plate 300 is provided, at predetermined positions on the surface thereof, with a plurality of small circular holes 220 extending therethrough, for receiving therethrough and hermetically sealing thereto corresponding electrical leads. On the other hand, the strip 100 has no holes for fitting ceramic terminals as in FIG. 14.

The bottom plate 300 may be provided, in place of or in addition to the lead sealing holes 220, with openings for inserting optical fibers or fitting ceramic terminals, in accordance with the intended type of the metal wall structure, itself.

In the same manner as the embodiment shown in FIG. 14, the metal bottom plate 300 is provided on the surface thereof, at several predetermined positions, with holes 220 for receiving therethrough and sealing therewithin corresponding lead members (not shown). Thus, the same members or portions are indicated by the same reference numerals as FIG. 14.

FIGS. 16 through 22 shown an alternative preferred embodiment of the second process for making the metal wall enclosure. In this embodiment, in the same manner as the first process of this embodiment and as shown in FIGS. 8 through 13, at least one of the opposite ends of the metal strip 100 is cut along an edge thereof.

Figure 18:
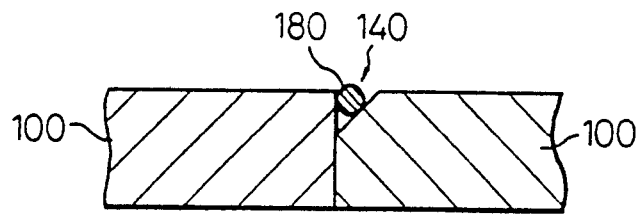
FIGS. 18 through 22 are enlarged cross-sectional views of the abutting ends of the folded strip in the second process for making a package metal wall enclosure.
Figure 19:
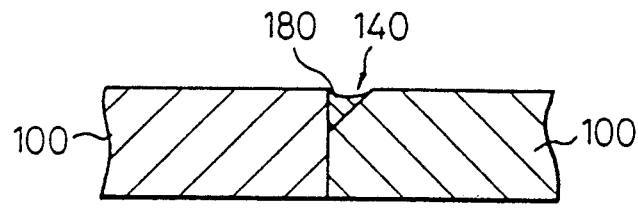
Figure 20:
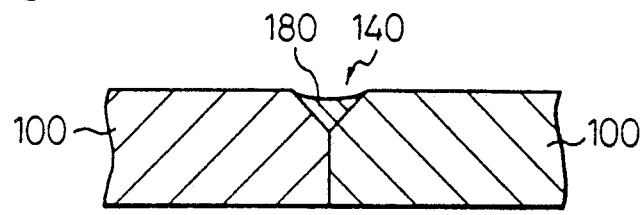
Figure 21:
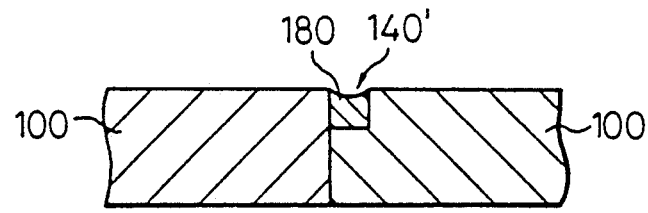
Figure 22:
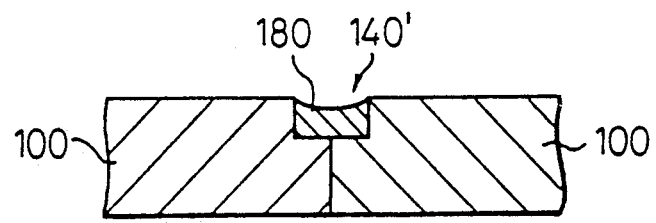

As shown in detail in FIGS. 18 and 19, or in FIG. 20, one end or both of the opposite ends of the metal strip 100 is/are provided at the inner edge thereof with an inclined cut(s) 140. Alternatively, as shown in FIGS. 21 or 22, one end or both the opposite ends of the metal strip 100 is/are provided at the inner edge(s) thereof with an L-shaped cut groove(s) 140'. Thus, when a ring-shaped rectangular frame is formed from the metal strip 100 by joining the opposite ends together, the solder or adhesion material can be collected in the respective, inclined-cut groove(s) 140 and the L-shaped groove(s) 140'.

As shown in FIG. 18, a rod-like solder material 180 is fitted into the adhesive collecting groove 140 of the metal strip 100 and then the work is put into a furnace (not shown), in which the solder material 180 flows into and permeates the abutting surfaces, and the spaced faces of the groove(s), between the respective ends of the metal strip 100. As shown in FIGS. 12 and 13 and also in FIGS. 19–22, the opposite ends of the metal strip 100 are hermetically sealed to each other by the solder material 180. Otherwise, a thin flat solder (not shown) for sealing may be inserted into the abutting gap between the respective end faces of the metal strip 100 and then the work may be put into a high temperature furnace in which the solder flows within and permeates the abutting gap (i.e., the interface) between the abutted opposite ends of the metal strip 100. Thus, the opposite ends of the metal strip 100 may be hermetically sealed to each other by the solder.

The solder material can be accumulated in layers to the desired thickness in the adhesion collecting groove(s) 140, 140' at the abutted ends of the metal strip 100 due to the surface tension exerted on the solder material. Thus, the sealing effect on the abutting faces between the respective ends of the metal strip 100 can be improved. Also, the solder material can be collected in the adhesion collecting groove 140 due to surface tension to prevent the solder material from flowing out of the collecting groove 140.

The sealing effect at the abutting faces thus is improved, for the same reasons as mentioned hereinbefore.

In the same manner as the previous embodiments, through use of the formed strips 100 and plates 300 shown in FIG. 14 or 15, a metal plate enclosure is thus obtained and therefore the same members or portions are indicated by the same reference numerals as FIG. 14 or 15.

In the above-mentioned first and second processes for making a metal wall enclosure of a package, if the metal strip 10 or 100 or the metal bottom plate 300 connected to the metal strip 100 is thick enough and as shown by the phantom lines in FIGS. 2 and 3, sub-grooves 16 may be provided on the outer surface of the metal strip 10 of 100, in opposed and aligned relationship with the V- or U-shaped grooves 12 or 120, or the groove 340 (FIG. 14) formed on the inner surface. Thus, the thickness of the strip 10 or 100 is remarkably reduced at the predetermined folding positions and, therefore, the strip 10 or 100 can easily be folded. In the same manner, the metal bottom plate 300 can easily be folded toward the ring-shaped rectangular strip 100.

On the other hand, if the metal strip 10 or 100 or the metal bottom plate 300 connected to the metal strip 100 is thin enough, such sub-grooves 16 would not be necessary. In this case, using a metal mold (not shown) or the like, the metal strip 10 or 100 can easily be bent or folded along the V- or U-shaped grooves 12 or 120, or along the groove 340 (FIG. 14).

Figure 16:
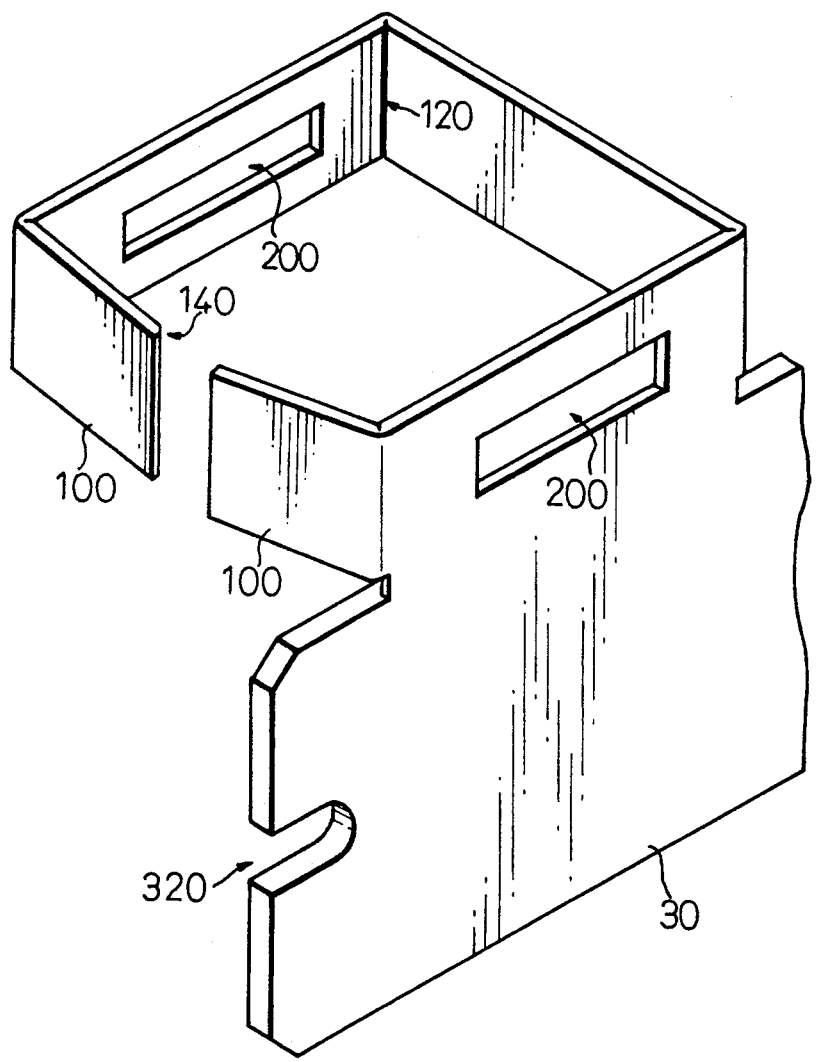
FIGS. 16 and 17 are perspective views illustrating a second process for making a metal wall enclosure according to the present invention.
Figure 17:
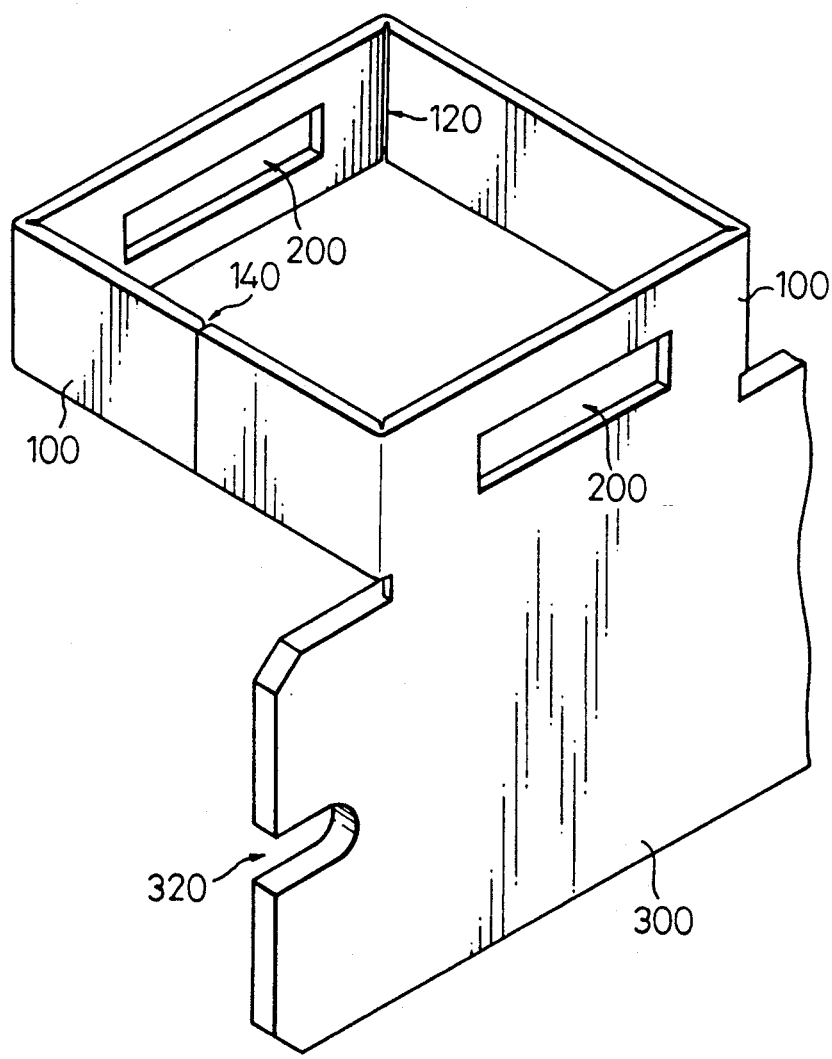

As shown in FIGS. 4-6 or 8-10, the opposite ends of the metal strip 10 or 100 may be positioned at a corner of the ring-shaped rectangular frame. Alternatively, as shown in FIGS. 16 and 17, the opposite ends of the metal strip 10 or 100 may be positioned at an intermediate flat portion of a sidewall, between the adjacent corners of the ring-shaped rectangular frame.

Figure 23:
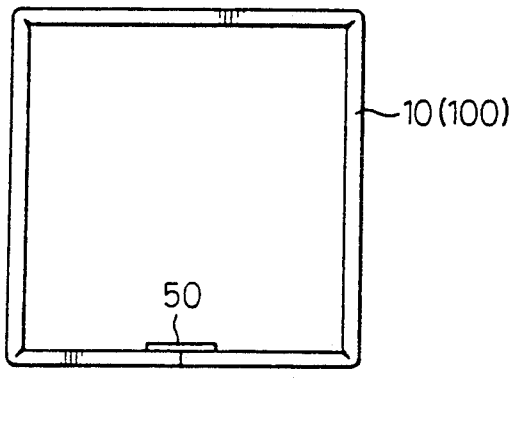
FIGS. 23 and 24 are plan views illustrating first and second processes for making a metal wall enclosure according to the present invention.

In addition, as shown in FIG. 23, an auxiliary plate 50 may be attached to the inner surface of the metal strip 10 or 100, spanning the abutted [at the respective]ends thereof. Thus, the opposite ends of the metal strip 10 or 100 are joined together by a soldering process with the auxiliary plate 50.

Figure 24:
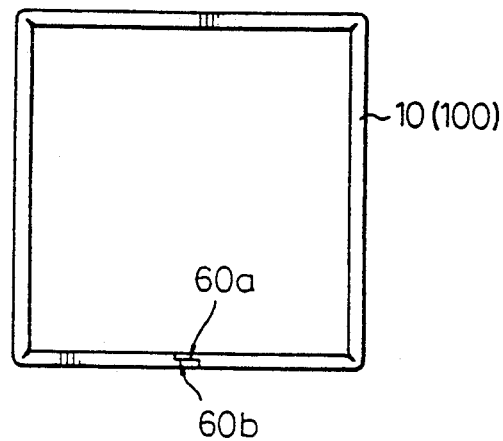

As shown in FIG. 24, the opposite ends of the metal strip 10 or 100 may be provided with complementary steps (i.e., stepped mating surfaces) 60a and 60b by a half-etching process or the like. Thus, the opposite ends of the metal strip 10 or 100 can be joined by soldering or the like while these complementary stepped surfaces 60a and 60b are precisely positioned in abutting and overlapping relationship with respect to each other, as shown in FIG. 24.

The opposite ends of the metal strip 10 or 100 may be first provisionally adhered to each other, such as by a spot welding or the like, and thus so as to be precisely positioned with respect to each other. Then, they are fixedly, hermetically adhered to each other by soldering or the like.

In the above-mentioned first and second processes for making a metal wall of a package, the metal strip 10 or 100 may be folded to be a triangular, hexagonal, octagonal or other desired geometrical shape in cross-section, in a plane parallel to the bottom metal plate (30, 30g).

Figure 25:
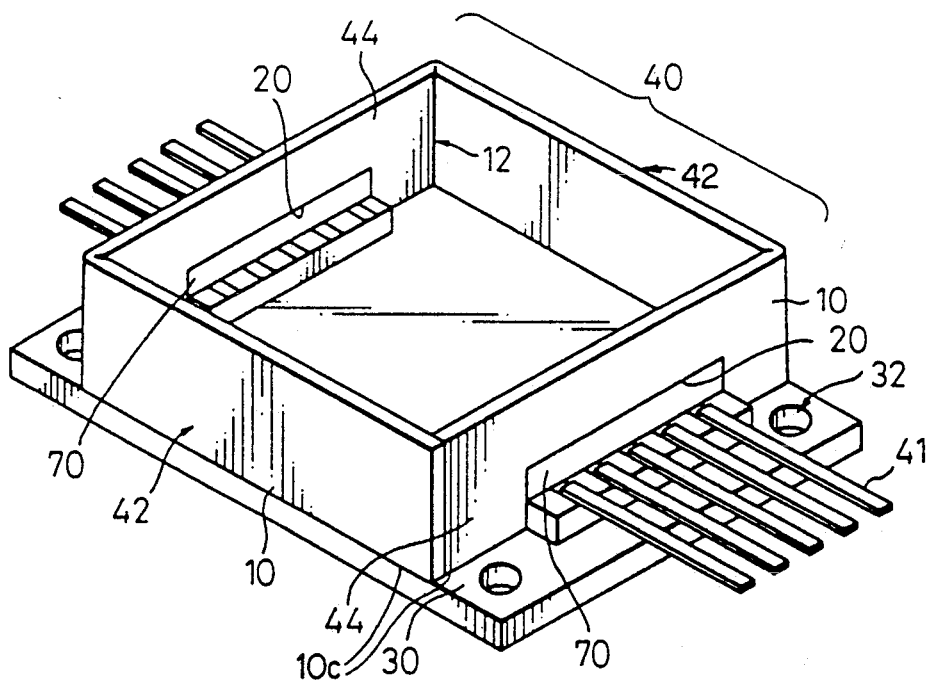
FIG. 25 is a perspective view of a package using a metal wall enclosure which is made in accordance with the present invention.

FIG. 25 is a perspective view of a package for accommodating an electronic element, using a metal wall enclosure which is made in accordance with the present invention as mentioned above. The metal wall enclosure 40, itself, is the same as that shown in FIG. 6 and, therefore, comprises a metal strip 10 folded as a ring-shaped rectangular frame, having a pair of opposite side walls 42 and a pair of opposite end walls 44, and a bottom metal plate 30. The lower opening deferred by the bottom edge 10c of the ring-shaped rectangular folded strip 10 is hermetically sealed to and thus closed by the bottom metal plate 30.

Each of the opposite end walls 44 is provided with a rectangular opening or recess 20, into which a ceramic lead terminal 70 is inserted and hermetically sealed.

Figure 26:
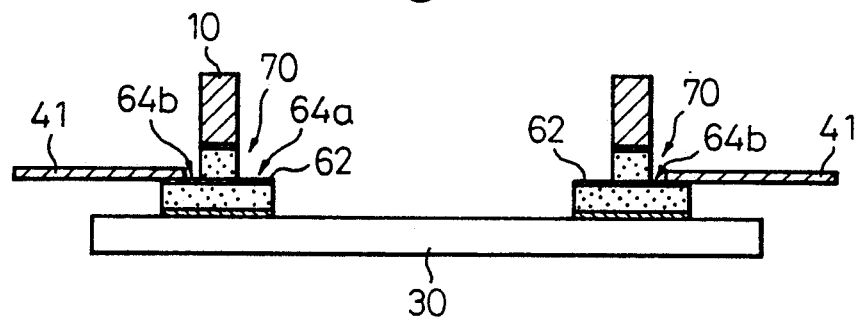
FIGS. 26 through 29 are cross-sectional views of the package shown in FIG. 25.

FIG. 26 is a cross-sectional view of the package shown in FIG. 25. Thus, the lower opening, defined by the lower edge 10c of the ring-shaped rectangular folded strip 10, is hermetically closed by a metal plate 30 made of a metal having a high thermal conductivity, such as, a copper-tungsten alloy or the like. The ceramic terminal 70 has a reverse T-shaped cross-section and, therefore, has a pair of steps 64a and 64b on which a plurality of conductive metallized lines 62 are formed. Further, a plurality of lead members 41 are connected to the metallized lines 62.

Figure 27:
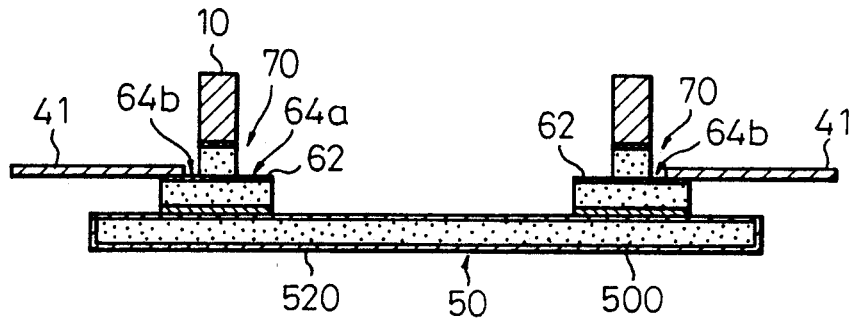

In FIG. 27, a ceramic bottom plate 50 is used in place of the metal bottom plate 30. The ceramic bottom plate 50 comprises a ceramic substrate 500 and a metallized layer 520 covering the opposite main surfaces and the lateral edges of the ceramic substrate 500. It is advantageous that the ceramic substrate 500 be made of a ceramic material, such as AlN, BN or CiC or the like, having a thermal coefficient matching that of the ceramic terminals 60.

Figure 28:
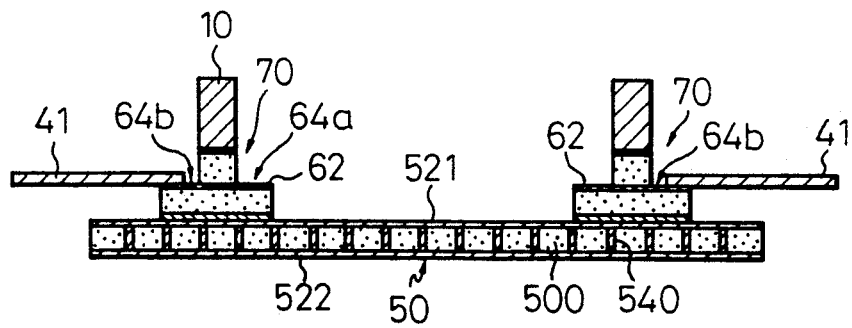

In the embodiment shown in FIG. 28, an upper metallized layer 521 and an lower metallized layer 522 are formed on the upper and lower main surfaces, respectively, of the ceramic substrate 500. Also, the ceramic substrate 500 has a plurality of via holes 540, each of which is filled with a conductive material thereby to electrically connect the upper metallized layer 521 to the lower metallized layer 522.

Figure 29:
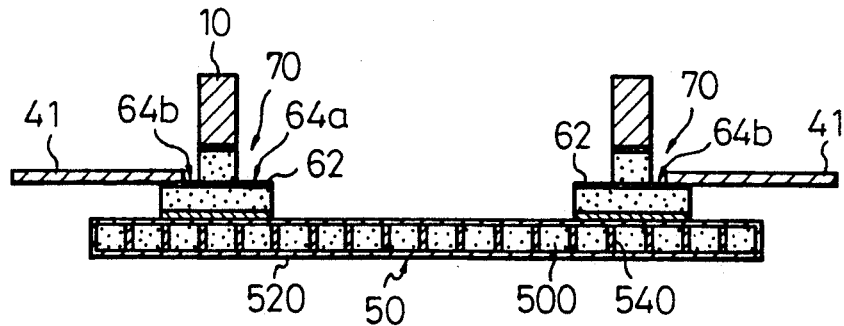

In another embodiment shown in FIG. 29, the entire surface of the ceramic substrate 500 is covered with a metallized layer 520. In the same manner as the embodiment shown in FIG. 28, the ceramic substrate 500 has a plurality of via holes 540, each of which is filled with a conductive material thereby to electrically connect the upper metallized layer and the lower metallized layer formed on the upper and lower surfaces, respectively, of the ceramic substrate 500.

We claim:

1. A process for making a metal wall enclosure of a package having an interior space therewithin for housing an electronic element, the metal wall enclosure comprising a metal sidewall and an integral bottom plate, the metal sidewall having upper and lower parallel edges spaced apart by a transverse dimension therebetween defining the height of the sidewall and, further, having a predetermined perimetrical dimension and configuration including transversely extending, angled corners, the sidewall thereby having an interior surface surrounding and defining an opening therethrough, and the integral bottom plate having an upper main surface having one edge portion, corresponding to one portion of the lower edge of the predetermined perimetrical configuration of the metal wall enclosure, integrally and continuously connected with the corresponding lower edge portion of the metal sidewall, the remaining lower edge portions of the metal sidewall being received and secured on the upper main surface of the integral bottom plate, the integral bottom plate thereby closing the corresponding lower edge opening of the metal sidewall, the process comprising;

forming a planar metal strip, having first and second, substantially parallel major surfaces, so as to have a lateral dimension between opposite ends thereof which corresponds to the predetermined perimetrical dimension of the sidewall and to have a pair of parallel edges, spaced by a transverse dimension corresponding to the height of the metal sidewall, and an integral bottom plate, the integral bottom plate extending integrally and continuously at the corresponding edge portion thereof from an edge portion of the planar metal strip defining the corresponding lower edge portion of the metal sidewall;

selectively forming at least one aperture in at least one of the planar metal strip and the integral bottom plate, the at least one aperture being formed at a position and being of a size for receiving therein a corresponding conductor element, the conductor element providing a connection therethrough, and thus from the exterior of the package and through the metal wall enclosure to the electronic element to be housed in the package;

forming first grooves in the first major surface of the strip respectively corresponding to the transversely extending, angled corners of the metal sidewall and forming a second groove in the first major surface of the strip extending along the respectively corresponding edge portions of the metal sidewall and the integral bottom plate at which the same are integrally and continuously connected, and forming third transverse grooves in the second major surface of the strip, respectively corresponding to and aligned with the first transverse grooves, the third transverse grooves extending to a lesser extent into the strip than the first grooves relatively to the second and first major surfaces, respectively, of the strip and forming a fourth groove extending into the strip from the second major surface thereof aligned with the second groove, the fourth groove extending to a lesser extent into the strip than the second groove from the respective second and first major surfaces thereof;

folding the strip along the aligned first and third transverse grooves for producing the transversely extending, angled corners and so as to dispose the opposite ends of the strip in abutting relationship, thereby forming the metal sidewall of the predetermined configuration surrounding an opening therethrough, and folding the integral bottom plate, relatively to the folded and formed metal sidewall, along the respective, aligned second and fourth grooves thereby to dispose the remaining lower edge portions of the metal sidewall, as formed by the folded strip, on the upper major surface of the integral bottom plate, the integral bottom plate thereby closing the corresponding, lower edge opening of the metal sidewall; and forming the metal wall enclosure by affixing and hermetically sealing, together, the abutting ends of the strip, as folded to form the metal sidewall, and the remaining bottom edge portions of the metal sidewall, as formed by the folded strip, and the upper major surface of the integral bottom plate.

2. A process as recited in claim 1, wherein each of the grooves has a V-shaped cross-section.

3. A process as recited in claim 1, wherein each of the grooves has a U-shaped cross-section.

4. A process as recited in claim 1, further comprising forming the first grooves and folding the strip so as to form a metal sidewall of a rectangular configuration in a plane parallel to the lower edge of the metal sidewall.

5. A process as recited in claim 1, further comprising:
maintaining the metal sidewall, as disposed at the lower edge thereof on the upper major surface of the integral bottom plate and with the opposite ends of the strip, as folded to form the metal sidewall, in abutting relationship and, simultaneously, affixing and hermetically sealing the abutting ends of the metal sidewall, as formed by the folded strip, and the remaining lower edge portions of the metal sidewall, as formed by the folded strip, to the integral bottom plate.

6. A process as recited in claim 1, further comprising, prior to folding the strip, shaping at least one of the opposite, transverse ends of the strip such that the abutted ends of the strip, when folded to form the metal sidewall, define a transverse recess therebetween.

7. A process as recited in claim 6, further comprising disposing an adhesive material in the transverse recess for affixing and hermetically sealing the abutted ends together.

8. A process as recited in claim 7, wherein the adhesive is a solder and the abutted ends are affixed together and hermetically sealed to each other by a soldering process which causes the solder to flow into and fill the transverse recess.

9. A process as recited in claim 8, wherein the bottom edge of the metal sidewall, as formed by the folded strip, is affixed and hermetically sealed to the integral bottom plate by a soldering process.

* * * * *